(12) United States Patent
Yang

(10) Patent No.: US 11,749,202 B2
(45) Date of Patent: Sep. 5, 2023

(54) DISPLAY PANEL HAVING A PIXEL DRIVING CIRCUIT WITH DIFFERENT TRANSISTOR TYPES

(71) Applicant: BOE TECHNOLOGY GROUP CO., LTD., Beijing (CN)

(72) Inventor: Qian Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/638,892

(22) PCT Filed: Apr. 20, 2021

(86) PCT No.: PCT/CN2021/088329
§ 371 (c)(1),
(2) Date: Feb. 28, 2022

(87) PCT Pub. No.: WO2021/227788
PCT Pub. Date: Nov. 18, 2021

(65) Prior Publication Data
US 2022/0310017 A1    Sep. 29, 2022

(30) Foreign Application Priority Data

May 11, 2020 (CN) .......................... 202010392539.1

(51) Int. Cl.
*G09G 3/3258* (2016.01)
*G09G 3/3291* (2016.01)

(52) U.S. Cl.
CPC ......... *G09G 3/3258* (2013.01); *G09G 3/3291* (2013.01); *G09G 2300/0819* (2013.01)

(58) Field of Classification Search
CPC .................................................. G09G 3/3258
(Continued)

(56) References Cited

U.S. PATENT DOCUMENTS 9,830,856 B2    11/2017  Kwon et al.
10,062,321 B2    8/2018  Na et al.
(Continued)

FOREIGN PATENT DOCUMENTS

CN    105427803 A    3/2016
CN    205282057 U    6/2016
(Continued)

OTHER PUBLICATIONS

International Search Report and Written Opinion dated Jun. 30, 2021, in International Application No. PCT/CN2021/088329.
(Continued)

*Primary Examiner* — Long D Pham
(74) *Attorney, Agent, or Firm* — XSENSUS LLP

(57) ABSTRACT

A pixel driving circuit comprises a data writing circuit, a driving circuit, a light emitting control circuit, a compensation circuit and a storage circuit, the data writing circuit is coupled to the driving circuit, for writing a data signal into the driving circuit; the driving circuit is coupled to a first power source end and a light-emitting sub-circuit through the light emitting control circuit, for inputting, under control of the light emitting control circuit, driving current into the light-emitting sub-circuit according to the data signal; the compensation circuit is coupled to the driving circuit; the storage circuit is coupled between the first power source end and the driving circuit; and the data writing circuit and the compensation circuit includes at least two transistors, wherein in the data write circuit and the compensation circuit, at least one transistor is a low-temperature polysilicon transistor, and at least one transistor is an oxide transistor.

19 Claims, 8 Drawing Sheets

(58) Field of Classification Search
USPC .......................................................... 345/76
See application file for complete search history.

(56) References Cited

U.S. PATENT DOCUMENTS

| | | | |
|---|---|---|---|
| 10,262,594 | B2 | 4/2019 | Ma |
| 2017/0061874 | A1 | 3/2017 | Kwon et al. |
| 2017/0124941 | A1 | 5/2017 | Na et al. |
| 2018/0190197 | A1* | 7/2018 | Chang .................. G09G 3/3233 |
| 2018/0301092 | A1 | 10/2018 | Ma |
| 2020/0111418 | A1* | 4/2020 | Nam .................... G09G 3/3266 |
| 2020/0184893 | A1 | 6/2020 | Dong |

FOREIGN PATENT DOCUMENTS

| | | | |
|---|---|---|---|
| CN | 106971172 | A | 7/2017 |
| CN | 108154845 | A | 6/2018 |
| CN | 108206008 | A | 6/2018 |
| CN | 108877661 | A | 11/2018 |
| CN | 109964316 | A | 7/2019 |
| CN | 110223636 | A | 9/2019 |
| CN | 110264946 | A | 9/2019 |
| CN | 110634890 | A | 12/2019 |
| CN | 111445854 | A | 7/2020 |
| EP | 3739565 | A1 | 11/2020 |

OTHER PUBLICATIONS

Chinese Office Action dated Dec. 24, 2020, in Chinese Application No. 202010395239.1.

* cited by examiner

DISPLAY PANEL HAVING A PIXEL DRIVING CIRCUIT WITH DIFFERENT TRANSISTOR TYPES

CROSS REFERENCE TO RELATED APPLICATIONS

The present application is a § 371 national phase application based on International Application No. PCT/CN2021/088329, filed on Apr. 20, 2021, which claims priority to a Chinese patent application with application number 202010392539.1 and entitled "PIXEL DRIVING CIRCUIT AND DRIVING METHOD THEREFOR, AND DISPLAY PANEL" filed on May 11, 2020, the entire contents of which are incorporated herein by reference in their entirety.

TECHNICAL FIELD

The present disclosure relates to the field of display technology and, in particular, to a pixel driving circuit and a driving method therefor, and a display panel.

BACKGROUND

A pixel driving circuit is used to drive a light-emitting sub-circuit in a pixel sub-circuit to emit light. In the related art, the pixel driving circuit needs to connect a plurality of signal lines, so as to provide signals to respective signal terminals of the pixel driving circuit through the signal lines. However, due to a large number of signal lines in the pixel driving circuit, it is not conducive to fabrication of display panels with high pixel density.

It should be noted that information disclosed in the above background is only for enhancing understanding of the background of the present disclosure, and therefore may include information that does not form the prior art known to a person of ordinary skill in the art.

SUMMARY

According to one aspect of the present disclosure, there is provided a pixel driving circuit, including: a data-writing circuit, a driving circuit, a light-emitting control circuit, a compensation circuit and a storage circuit, wherein the data-writing circuit is coupled to the driving circuit, for writing a data signal to the driving circuit; the driving circuit is coupled to a first power supply end and a light-emitting sub-circuit through the light-emitting control circuit, for inputting a driving current to the light-emitting sub-circuit according to the data signal under control of the light-emitting control circuit; the compensation circuit is coupled to the driving circuit; the storage circuit is coupled between the first power supply end and the driving circuit; and the data-writing circuit and the compensation circuit together include at least two transistors, wherein, in the data-writing circuit and the compensation circuit, at least one transistor is a low temperature polysilicon transistor, and at least one transistor is an oxide transistor.

In an exemplary embodiment of the present disclosure, the data-writing circuit is connected to a data signal end, a gate driving signal end and a first node, for transmitting a signal of the data signal end to the first node in response to a signal of the gate driving signal end; the driving circuit is connected to the first node, a second node, and a third node, for inputting the driving current to the second node according to a signal of the first node; the light-emitting control circuit is connected to the third node, the second node, the first power supply end, a fourth node and an enable signal end, for transmitting a signal of the first power supply end to the third node in response to a signal of the enable signal end, and for transmitting a signal of the second node to the fourth node in response to the signal of the enable signal end; the compensation circuit is connected to the first node, the second node and a reset signal end, for transmitting a signal of the reset signal end to the first node and the second node in response to the signal of the reset signal end; and the storage circuit includes a first storage circuit and a second storage circuit; wherein the first storage circuit is connected between the first node and the third node; the second storage circuit is connected between the third node and the first power supply end; and the light-emitting sub-circuit is connected between the fourth node and a second power supply end.

In an exemplary embodiment of the present disclosure, the data-writing circuit and the compensation circuit together include at least two transistors connected to the first node, wherein in the transistors of the data-writing circuit and the compensation circuit connected to the first node, at least one transistor is a low temperature polysilicon transistor, and at least one transistor is an oxide transistor.

In an exemplary embodiment of the present disclosure, the data-writing circuit includes: a first switch transistor, having a first end connected to the data signal end, a second end connected to the first node, and a control end connected to the gate driving signal end.

In an exemplary embodiment of the present disclosure, the driving circuit includes: a driving transistor, having a first end connected to the third node, a second end connected to the second node, and a control end connected to the first node.

In an exemplary embodiment of the present disclosure, the light-emitting control circuit includes: a second switch transistor, having a first end connected to the first power supply end, a second end connected to the third node, and a control end connected to the enable signal end; and a third switch transistor, having a first end connected to the second node, a second end connected to the fourth node, and a control end connected to the enable signal end.

In an exemplary embodiment of the present disclosure, the compensation circuit includes: a fourth switch transistor, having a first end connected to the reset signal end, a second end connected to the first node, and a control end connected to the reset signal end; and a fifth switch transistor, having a first end connected to the reset signal end, a second end connected to the second node, and a control end connected to the reset signal end.

In an exemplary embodiment of the present disclosure, the first storage circuit includes: a first capacitor, connected between the first node and the third node.

In an exemplary embodiment of the present disclosure, the second storage circuit includes: a second capacitor, connected between the third node and the first power supply end.

In an exemplary embodiment of the present disclosure, the first switch transistor is an oxide transistor, and the second switch transistor, the third switch transistor, the fourth switch transistor, the fifth switch transistor and the driving transistor are low temperature polysilicon transistors.

In an exemplary embodiment of the present disclosure, the fourth switch transistor is an oxide transistor, and the second switch transistor, the third switch transistor, the first switch transistor, the fifth switch transistor and the driving transistor are low temperature polysilicon transistors.

In an exemplary embodiment of the present disclosure, the first switch transistor is an N-type switch transistor, and the second switch transistor, the third switch transistor, the fourth switch transistor, the fifth switch transistor and the driving transistor are P-type switch transistors.

According to an aspect of the present disclosure, there is provided a driving method of pixel driving circuit, for driving the above-mentioned pixel driving circuit, including:

in a reset phase, a turn-on signal is input to the reset signal end, and at the same time, a turn-off signal is input to the enable signal end;

in a compensation phase, a turn-on signal is input to the reset signal end, and at the same time, a turn-off signal is input to the enable signal end;

in a data-writing phase, a data signal is input to the data signal end, and at the same time, a turn-on signal is input to the gate driving signal end and a turn-off signal is input to the reset signal end; and in a light-emitting phase, a turn-on signal is input to the enable signal end, and at the same time, a turn-off signal is input to the reset signal end.

In an exemplary embodiment of the present disclosure, C2(Vdata−Vref)/(C1+C2)+Vdd+Vth−Vinit<V1;

wherein C1 is a capacitance value of the first capacitor, C2 is a capacitance value of the second capacitor, Vdata is a voltage value of the data signal, Vref is a voltage value of the turn-on signal input to the reset signal end in the compensation phase, Vdd is a voltage value of the first power supply end, Vth is a threshold voltage of the driving transistor, Vinit is a voltage value of the turn-off signal input to the reset signal end in the light-emitting phase, and V1 is a preset voltage value.

According to one aspect of the present disclosure, there is provided a display panel including the above-mentioned pixel driving circuit.

In an exemplary embodiment of the present disclosure, the display panel further includes a gate drive circuit, the gate drive circuit includes a plurality of shift register sub-circuits cascaded one another, the shift register sub-circuit includes a first output end and a second output end, and signal potentials of the first output end and the second output end are logically opposite to each other; the first output end of an n-th stage of shift register sub-circuit is connected to the gate driving signal end of an n-th row of pixel driving circuit, for outputting a gate driving signal to the gate driving signal end; and the second output end of the n-th stage of shift register is connected to the reset signal end of an (n+1)-th row of pixel driving circuit, for outputting a turn-on signal or a turn-off signal to the reset signal end of the pixel driving circuit, where n is a positive integer greater than or equal to 1.

In an exemplary embodiment of the present disclosure, the shift register circuit includes: a first input circuit, connected to a third power supply end, a fifth node and a first clock signal end, for transmitting a signal of the third power supply end to the fifth node in response to a signal of the first clock signal end; a second input circuit, connected to the first clock signal end, an input signal end and a sixth node, for transmitting a signal of the input signal end to the sixth node in response to the signal of the first clock signal end; a first output circuit, connected to the fifth node, a fourth power supply end and a seventh node, for transmitting a signal of the fourth power supply end to the seventh node in response to a signal of the fifth node; a second output circuit, connected to the seventh node, a second clock signal end and a eighth node, for transmitting a signal of the second clock signal end to the seventh node in response to a signal of the eighth node; an isolation circuit, connected to the sixth node, a third power supply end and the eighth node, for connecting the sixth node to the eighth node in response to a signal of the third power supply end; a first control circuit, connected to the fifth node, the first clock signal end and the sixth node, for transmitting the signal of the first clock signal end to the fifth node in response to a signal of the sixth node; a second control circuit, connected to the fifth node, the sixth node and the second clock signal end, for connecting the fifth node to the sixth node in response to the signals of both the fifth node and the second clock signal end at the same time; a second inverter circuit, having an input end connected to the seventh node, and an output end is connected to the first output end; and a first inverter circuit, having an input end connected to the first output end, and an output end connected to the second output end.

In an exemplary embodiment of the present disclosure, the first input circuit includes: a sixth switch transistor, having a first end connected to the third power supply end, a second end connected to the fifth node, and a control end connected to the first clock signal end; the second input circuit includes: a seventh switch transistor, having a first end connected to the input signal end, a second end connected to the sixth node, and a control end connected to the first clock signal end; the first output circuit includes: an eighth switch transistor, having a first end connected to the fourth power supply end, a second end connected to the seventh node, and a control end connected to the fifth node; and a third capacitor, connected between the fourth power supply end and the fifth node; the second output circuit includes: a ninth switch transistor, having a first end connected to the second clock signal end, a second end connected to the seventh node, and a control end connected to the eighth node; and a fourth capacitor, connected between the eighth node and the seventh node; the isolation circuit includes: a tenth switch transistor, having a first end connected to the sixth node, a second end connected to the eighth node, and a control end connected to the third power supply end; the first control circuit includes: an eleventh switch transistor, having a first end connected to the fifth node, a second end connected to the first clock signal end, and a control end connected to the sixth node; the second control circuit includes: a twelfth switch transistor, having a first end connected to the fifth node, a second end, and a control end connected to the fifth node; and a thirteenth switch transistor, having a first end connected to the second end of the twelfth switch transistor, a second end connected to the sixth node, and a control end connected to the second clock signal end; the second inverter circuit includes: a fourteenth switch transistor, having a first end connected to the fourth power supply end, a second end connected to the ninth node, and a control end is connected to the seventh node; a fifteenth switch transistor, having a first end connected to the third power supply end, a second end connected to the ninth node, and a control end connected to the third clock signal end; a sixteenth switch transistor, having a first end connected to the fourth power supply end, a second end connected to the first output end, and a control end connected to the seventh node; a seventeenth switch transistor, having a first end connected to the third power supply end, a second end connected to the first output end, and a control end is connected to the ninth node; a fifth capacitor, connected between the first output end and the ninth node; and a sixth capacitor, connected between the ninth node and the fourth clock signal end; and the first inverter circuit includes: an eighteenth N-type switch transistor, having a first end connected to the fifth power supply end, a second end connected to the second output end, and a control end connected to the first output end; and a nineteenth P-type switch transistor, having a first end connected to the sixth power supply end, a second end connected to the second output end, and a control end connected to the first output end.

It is to be understood that the foregoing general description and the following detailed description are exemplary and explanatory only and are not limiting of the present disclosure.

BRIEF DESCRIPTION OF THE DRAWINGS

The accompanying drawings, which are incorporated in and constitute a part of this specification, illustrate embodiments consistent with the disclosure and together with the specification serve to explain the principle of the disclosure. Apparently, the drawings in the following description are only some embodiments of the present disclosure, and for those of ordinary skill in the art, other drawings may be obtained from these drawings as well without creative efforts.

DETAILED DESCRIPTION

Figure 1:
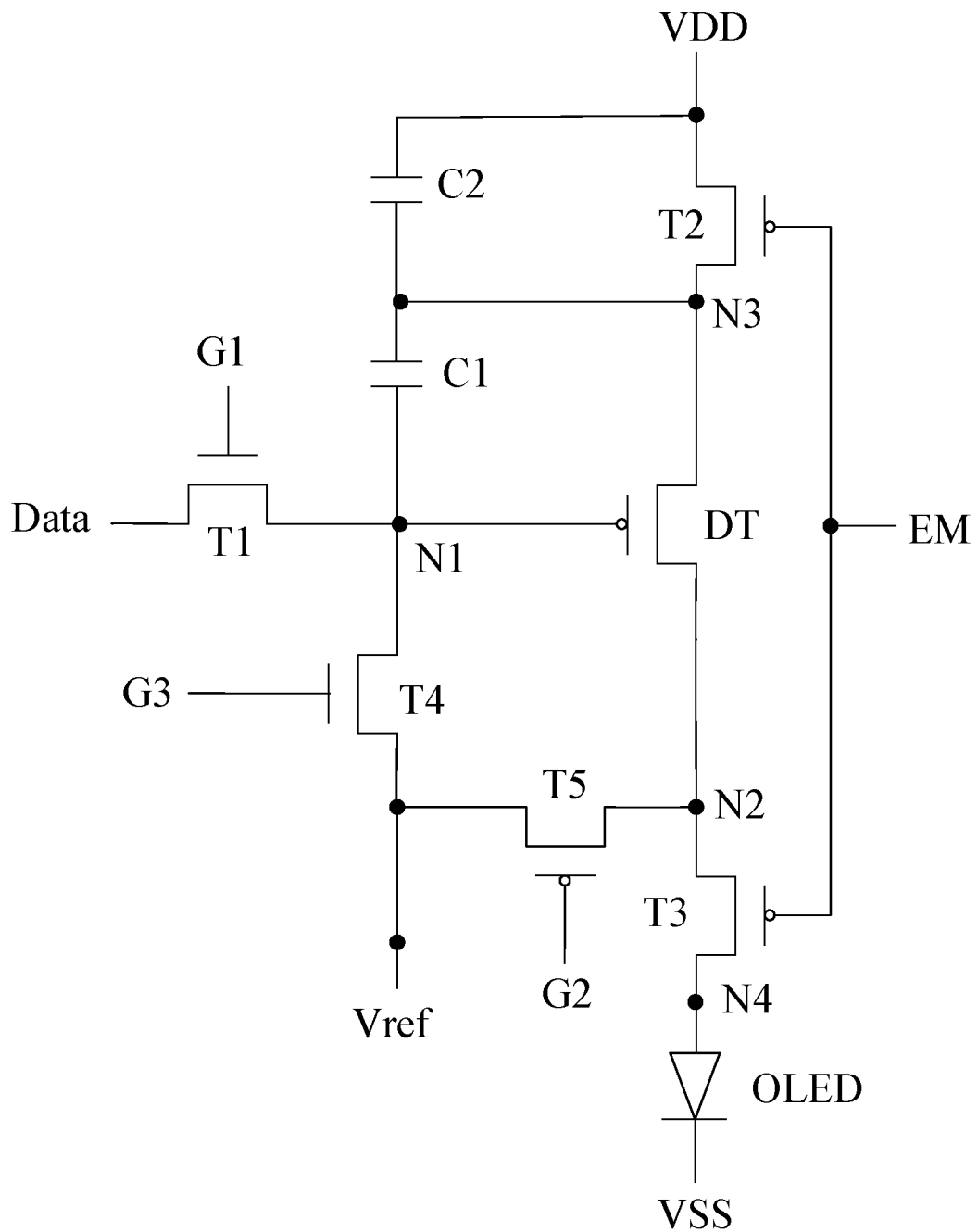
FIG. 1 is a schematic structural diagram of a pixel driving circuit in the related art.

Example embodiments will now be described more fully with reference to the accompanying drawings. However, example embodiments may be embodied in various forms and should not be construed as limited to the examples set forth herein; rather, these embodiments are provided so that this disclosure will be more thorough and complete, and will fully convey the concept of example embodiments to those skilled in the art. The same reference signs in the drawings denote the same or similar structures, and thus their detailed descriptions will be omitted.

Although relative terms such as "upper" and "lower" are used in this specification to describe a relative relationship of one component to another component marked in the drawings, these terms are used in this specification only for convenience, for example, a direction according to an example described in the drawings. It will be appreciated that if the device marked in the drawings is turned upside down, the component described as "upper" will become a component "lower". Other relative terms, such as "high", "low", "top", "bottom", "left", and "right", are used to have similar meanings as well. When a certain structure is "on" other structures, it may mean that the certain structure is integrally formed on the said other structures, or that the certain structure is "directly" arranged on the said other structures, or that the certain structure is "indirectly" arranged on the said other structures through another structure.

The terms "a", "an", and "the" are used to indicate the presence of one or more elements/components/etc.; the terms "including" and "having" are used to indicate an open-ended inclusive meaning and refer to that additional elements/components/etc. may be present in addition to the listed elements/components/etc.

Figure 2:
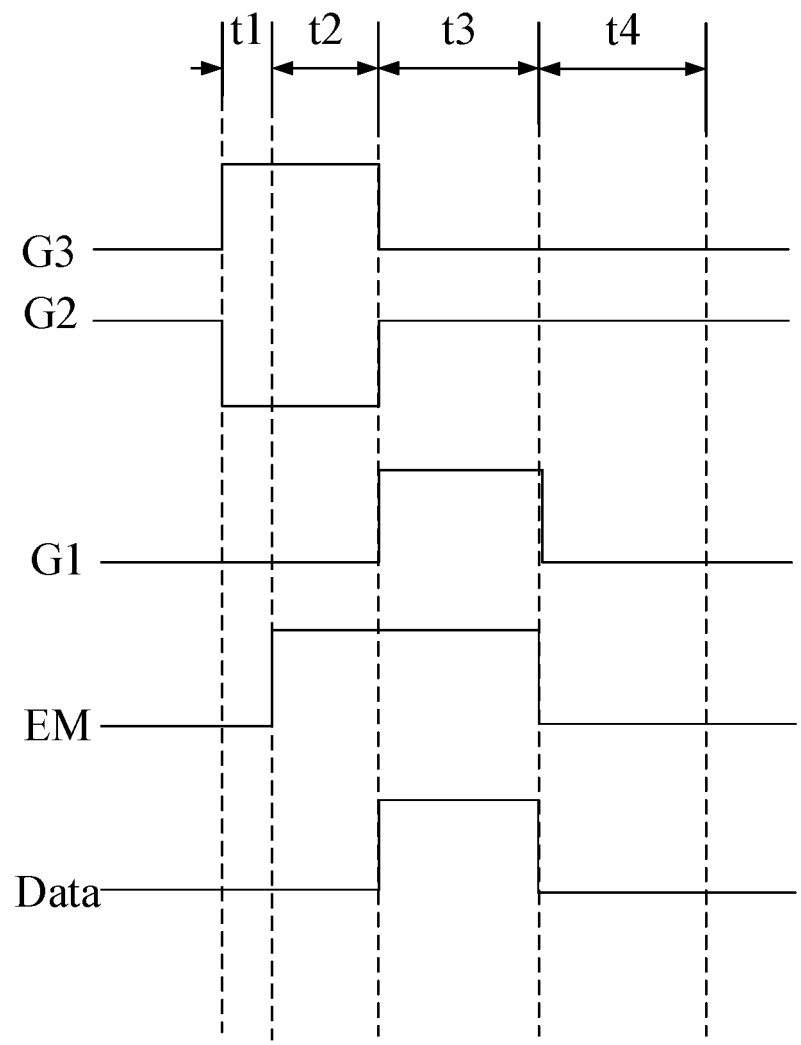
FIG. 2 is a timing diagram of respective nodes in a driving method of the pixel driving circuit in FIG. 1.

As shown in FIGS. 1 and 2, FIG. 1 is a schematic structural diagram of a pixel driving circuit in the related art. FIG. 2 is a timing diagram of respective nodes in a driving method of the pixel driving circuit in FIG. 1. As shown in FIG. 1, the pixel driving circuit includes a first transistor T1, a second transistor T2, a third transistor T3, a fourth transistor T4, a fifth transistor T5, a driving transistor DT, a first capacitor C1 and a second capacitor C2. A first end of the first transistor T1 is connected to a data signal end Data, a second end of the first transistor T1 is connected to a first node N1, and a control end of the first transistor T1 is connected to a first control end G1. A first end of the driving transistor DT is connected to a third node N3, a second end of the driving transistor DT is connected to a second node N2, and a control end of the driving transistor DT is connected to the first node N1. A first end of the second transistor T2 is connected to a first power supply end VDD, a second end of the second transistor is connected to the third node N3, and a control end of the second transistor is connected to an enable signal end EM. A first end of the third transistor T3 is connected to the second node N2, a second end of the third transistor T3 is connected to a fourth node N4, and a control end of the third transistor T3 is connected to the enable signal end EM. A first end of the fourth transistor T4 is connected to the first node N1, the second end of the fourth transistor is connected to a reference voltage end Vref, and a control end of the fourth transistor is connected to a third control end G3. A first end of the fifth transistor T5 is connected to the reference voltage end Vref, the second end of the fifth transistor T5 is connected to the second node N2, and a control end of the fifth transistor T5 is connected to a second control end G2. The first capacitor C1 is connected between the first node N1 and the three nodes N3. The second capacitor C2 is connected between the third node N3 and the first power supply end VDD. The pixel driving circuit may further be connected to a light-emitting sub-circuit OLED, and the light-emitting sub-circuit OLED may be connected between the fourth node N4 and a second power supply end VSS. The first transistor T1 and the fourth transistor T4 may be oxide transistors, and the second transistor T2, the third transistor T3, the fifth transistor T5 and the driving transistor DT may be low temperature polysilicon transistors. The low temperature polysilicon transistors have higher carrying mobility, thus are beneficial to realize a display panel with high resolution, high response speed, high pixel density, and high aperture ratio. The oxide transistors have small leakage current, so that it may be avoided that the first node N1 leaks current through the first transistor T1 and the fourth transistor T4 in a light-emitting phase. In addition, the first transistor T1 and the fourth transistor T4 may be N-type transistors, and the second transistor T2, the third transistor T3, the fifth transistor T5 and the driving transistor DT may be P-type transistors.

As shown in FIG. 2, the driving method for the pixel driving circuit may include four phases: a reset phase t1, a compensation phase t2, a data-writing phase t3 and a light-emitting phase t4. In the reset phase t1, a high level signal is input to the third control end G3, a low level signal is input to the second control end G2, a low level signal is input to the enable signal end EM, the fourth transistor T4, the fifth transistor T5, the second transistor T2 and the third transistor T3 are turned on, and a reset signal is input from the reference power supply end Vref to the first node N1 and the second node N2. In the compensation phase t2, a high level signal is input to the third control end G3, a low level signal is input to the second control end G2, a high level signal is input to the enable signal end EM, the fourth transistor T4 and the fifth transistor T5 are turned on, the second transistor T2 and the third transistor T3 are turned off, and at this time, a voltage at the third node N3 is Vref−Vth, where Vref is a voltage being input to the reference voltage end Vref, and Vth is a threshold voltage of the driving transistor DT. In the data-writing phase t3, high level signals are input to the first control end G1 and the second control end G2, a low level signal is input to the third control end G3, the fourth transistor T4 and the fifth transistor T5 are turned off, the first transistor T1 is turned on, and at this time, a voltage of the first node N1 is Vdata, and the voltage of the third node N3 is C1(Vdata−Vref)/(C1+C2)+Vref−Vth. Where C1 is a capacitance value of the first capacitor C1, C2 is a capacitance value of the second capacitor C2, and Vdata is a voltage of a data signal being input to the data signal end Data. In the light-emitting phase t4, a low level signal is input to the first control end G1, a low level signal is input to the enable signal end EM, the first transistor T1 is turned off, the second transistor T2 and the third transistor T3 are turned on, and at this time, the voltage of the third node becomes Vdd, and the voltage of the first node N1 becomes C2 (Vdata−Vref)/(C1+C2)+Vdd+Vth, where Vdd is a voltage of the first power supply end. According to output characteristics of the drive transistor, at this time, an output current of the drive transistor, $I=(\mu W C_{ox}/2L)(V_{gs}-V_{th})^2 = (\mu W C_{ox}/2L)[C2(V_{data}-V_{ref})/(C1+C2)]^2$, where μ is carrier mobility, Cox is gate capacitance per unit area, W is a width of channel of the drive transistor, L is a length of channel of the drive transistor, Vgs is a gate-source voltage difference of the drive transistor, and Vth is the threshold voltage of the drive transistor. The pixel driving circuit can avoid influence of the threshold voltage of the driving transistor and voltage drop of power supply line of the first power supply end VDD on driving current. However, the reference voltage end Vref, the first control end G1, the second control end G2, the third control end G3, the enable signal end EM, the data signal end Data, and the first power supply end VDD in the pixel driving circuit all need signal lines to provide corresponding signals, and too many signal lines will limit pixel density of the display panel.

Figure 3:
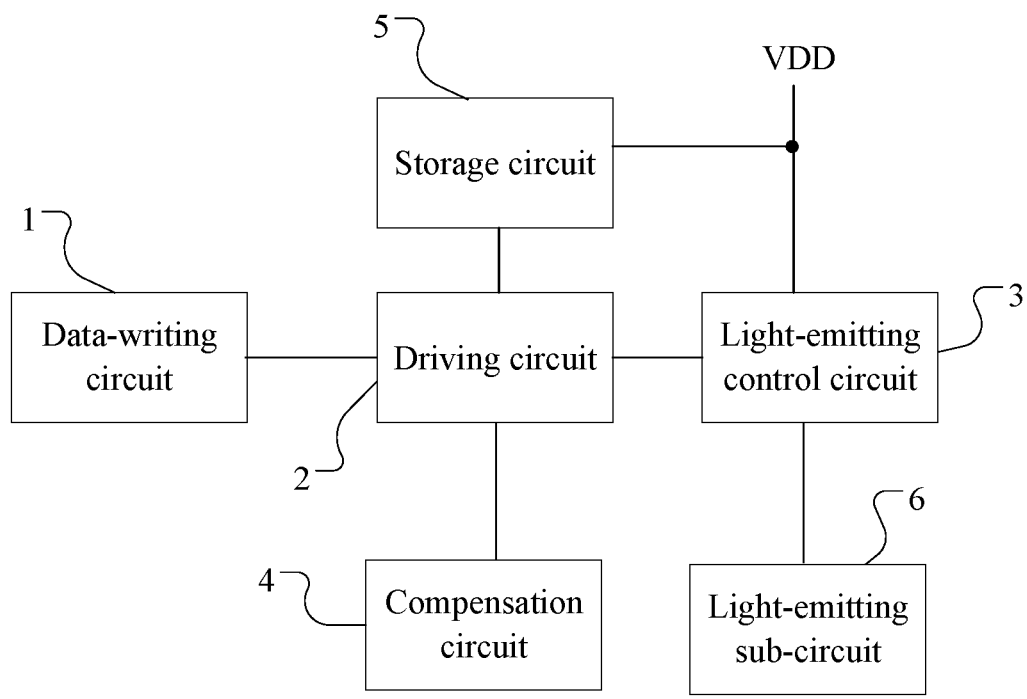
FIG. 3 is a schematic structural diagram of an exemplary embodiment of a pixel driving circuit of the present disclosure.

Based on the above, the present exemplary embodiment provides a pixel driving circuit, as shown in FIG. 3, which is a schematic structural diagram of an exemplary embodiment of the pixel driving circuit of the present disclosure. The pixel driving circuit includes a data-writing circuit 1, a driving circuit 2, a light-emitting control circuit 3, a compensation circuit 4 and a storage circuit 5. The data-writing circuit 1 is coupled to the driving circuit 2, and is used for writing data signals to the driving circuit 2. The driving circuit 2 is coupled to the first power supply end VDD and the light-emitting sub-circuit 6 through the light-emitting control circuit 3, and is used to input the driving current to the light-emitting sub-circuit 6 according to the data signal under control of the light-emitting control circuit 3. The compensation circuit 4 is coupled to the driving circuit 3. The storage circuit 5 is coupled between the first power supply end VDD and the driving circuit 2. The data-writing circuit 1 and the compensation circuit 4 together include at least two transistors, wherein, in the data-writing circuit 1 and the compensation circuit 4, at least one transistor is a low temperature polysilicon transistor, and at least one transistor is an oxide transistor.

In this exemplary embodiment, the data-writing circuit 1 and the compensation circuit 4 together include at least two transistors, wherein, in the data-writing circuit 1 and the compensation circuit 4, at least one transistor is a low temperature polysilicon transistor, and at least one transistor is an oxide transistor. The low temperature polysilicon transistor has high carrier mobility, so the pixel driving circuit is beneficial to realize a display panel with high resolution, high response speed, high pixel density and high aperture ratio. The oxide transistor has small leakage current, which can avoid current leakage of the storage circuit 5 of the pixel driving circuit in the light-emitting phase.

Figure 4:
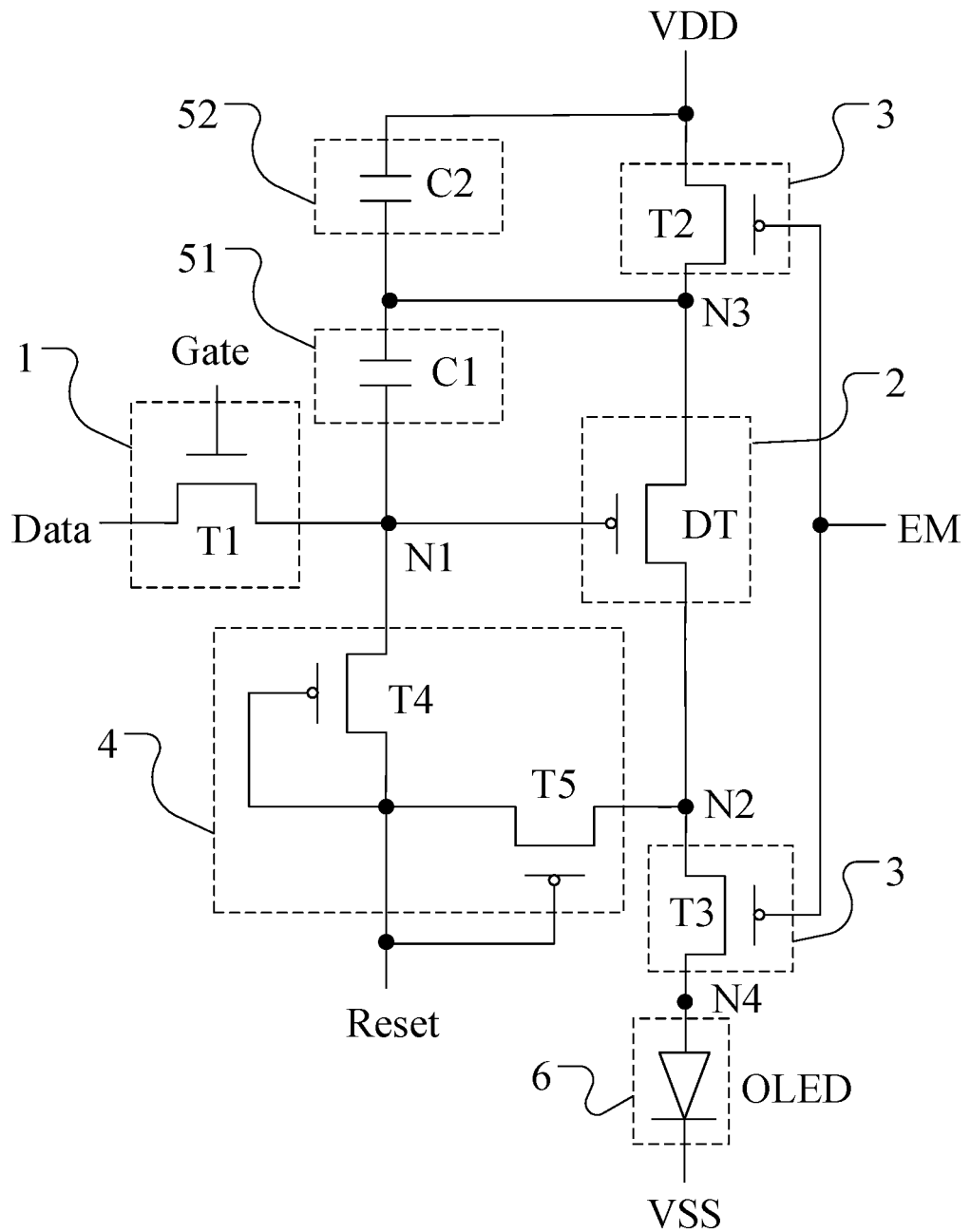
FIG. 4 is a schematic structural diagram of another exemplary embodiment of a pixel driving circuit of the present disclosure.

As shown in FIG. 4, it is a schematic structural diagram of another exemplary embodiment of a pixel driving circuit of the present disclosure. The data-writing circuit 1 may be connected to the data signal end Data, a gate driving signal end Gate and the first node N1, for transmitting the signal of the data signal end Data to the first node N1 in response to a signal of the gate driving signal end Gate. The driving circuit 2 may be connected to the first node N1, the second node N2 and the third node N3, for inputting a driving current to the second node N2 according to the signal of the first node N1. The light-emitting control circuit 3 may be connected to the third node N3, the second node N2, the first power supply end VDD, the fourth node N4 and the enable signal end EM, for transmitting a signal of the power supply end VDD is to the third node N3 in response to a signal of the enable signal end EM, and transmitting the signal of the second node N2 to the fourth node N4 in response to the signal of the enable signal end EM. The compensation circuit 4 may be connected to the first node N1, the second node N2 and a reset signal end Reset, for transmitting a signal of the reset signal end Reset to the first node N1 and the second node N2 in response to the signal of the reset signal end Rese. The storage circuit 5 may include a first storage circuit 51 and a second storage circuit 52, the first storage circuit 51 is connected between the first node N1 and the third node N3, and the second storage circuit 52 is connected between the third node N3 and the first power supply end VDD. The light-emitting sub-circuit 6 may be connected between the second power supply end VSS and the fourth node N4.

The pixel driving circuit provided by the exemplary embodiment includes the data signal end Data, the gate driving signal end Gate, the reset signal end Reset, the first power supply end VDD and the enable signal end EM. Compared with the related art, it is apparent that the pixel driving circuit in the exemplary embodiment has fewer signal ends, and correspondingly requires fewer signal lines, so that the pixel driving circuit is favorable for realizing a display panel with high pixel density.

In this exemplary embodiment, the data-writing circuit and the compensation circuit together include at least two transistors connected to the first node, among the transistors of the data-writing circuit and the compensation circuit connected to the first node, at least one transistor is a low temperature polysilicon transistor, and at least one transistor is an oxide transistor. The low temperature polysilicon transistor has high carrier mobility, so the pixel driving circuit is beneficial to realize a display panel with high resolution, high response speed, high pixel density and high aperture ratio. The oxide transistor has small leakage current, so that current leakage of the first node of the pixel driving circuit in the light-emitting phase may be avoided.

In this exemplary embodiment, as shown in FIG. 4, the data-writing circuit 1 may include a first switch transistor T1, and the first switch transistor T1 has a first end connected to the data signal end Data, a second end connected to the first node N1, and a control end connected to the gate driving signal end Gate. The driving circuit 2 may include a driving transistor DT, the driving transistor DT has a first end connected to the third node N3, a second end connected to the second node N2, and a control end connected to the first node N1. The light-emitting control circuit 3 may include a second switch transistor T2 and a third switch transistor T3, the second switch transistor T2 has a first end connected to the first power supply end VDD, a second end connected to the third node N3, and a control end connected to the enable signal end EM, and the third switch transistor T3 has a first end connected to the second node N2, a second end connected to the fourth node N4, and a control end connected to the enable signal end EM. The compensation circuit 4 may include a fourth switch transistor T4 and a fifth switch transistor T5, the fourth switch transistor T4 has a first end connected to the reset signal end Reset, a second end connected to the first node N1, and a control end connected to the reset signal end Reset, and the fifth switch transistor T5 has a first end connected to the reset signal end Reset, a second end connected to the second node N2, and a control end connected to the reset signal end Reset. The first storage circuit 51 may include a first capacitor C1 connected between the first node N1 and the third node N3. The second storage circuit 52 may include a second capacitor C2 connected between the third node N3 and the first power supply end VDD.

In this exemplary embodiment, as shown in FIG. 4, the light-emitting sub-circuit may be an OLED light-emitting sub-circuit, and the OLED light-emitting sub-circuit may be connected between the fourth node N4 and the second power supply end VSS.

It should be understood that, in other exemplary implementations, the data-writing circuit 1, the driving circuit 2, the light-emitting control circuit 3, the compensation circuit 4, the first storage circuit 51, and the second storage circuit 52 may be other structures as well, which are all belong to the protection scope of the present disclosure.

In this exemplary embodiment, as shown in FIG. 4, the first switch transistor T1 may be an oxide transistor, the second switch transistor T2, the third switch transistor T3, the fourth switch transistor T4, the fifth switch transistor T5, and the driving transistor DT may be low temperature polysilicon transistors. A channel region of the oxide transistor may be indium gallium zinc oxide. The low temperature polysilicon transistors have high carrier mobility, so the pixel driving circuit is beneficial to realize a display panel with high resolution, high response speed, high pixel density and high aperture ratio. The oxide transistor has small leakage current, so that it may be avoided that the first node N1 leaks current through the first switch transistor T1 in the light-emitting phase. In addition, compared with the related art, the present exemplary embodiment replaces the fourth switch transistor T4 with a low-temperature polysilicon transistor. Since the low-temperature polysilicon transistor is smaller in size than an oxide transistor, the pixel driving circuit can reduce a size of a pixel sub-circuit, so that pixel density of the display panel may be further increased. It should be understood that, in other exemplary embodiments, the fourth switch transistor may be an oxide transistor, and the second switch transistor, the third switch transistor, the first switch transistor, the fifth switch transistor and the driving transistor may be low temperature polysilicon transistors. Alternatively, the fifth switch transistor may be an oxide transistor, and the second switch transistor, the third switch transistor, the first switch transistor, the fourth switch transistor and the driving transistor may be low temperature polysilicon transistors.

In this exemplary embodiment, since the indium gallium zinc oxide is an N-type semiconductor, the oxide transistor can only be an N-type transistor. As shown in FIG. 4, the first switch transistor may be an N-type transistor. In addition, as shown in FIG. 4, the second switch transistor T2, the third switch transistor T3, the fourth switch transistor T4, the fifth switch transistor T5 and the driving transistor DT may be P-type transistors. It should be understood that, in other exemplary embodiments, the second switch transistor T2, the third switch transistor T3, the fourth switch transistor T4, the fifth switch transistor T5 and the driving transistor DT may be N-type switch transistors as well.

Figure 5:
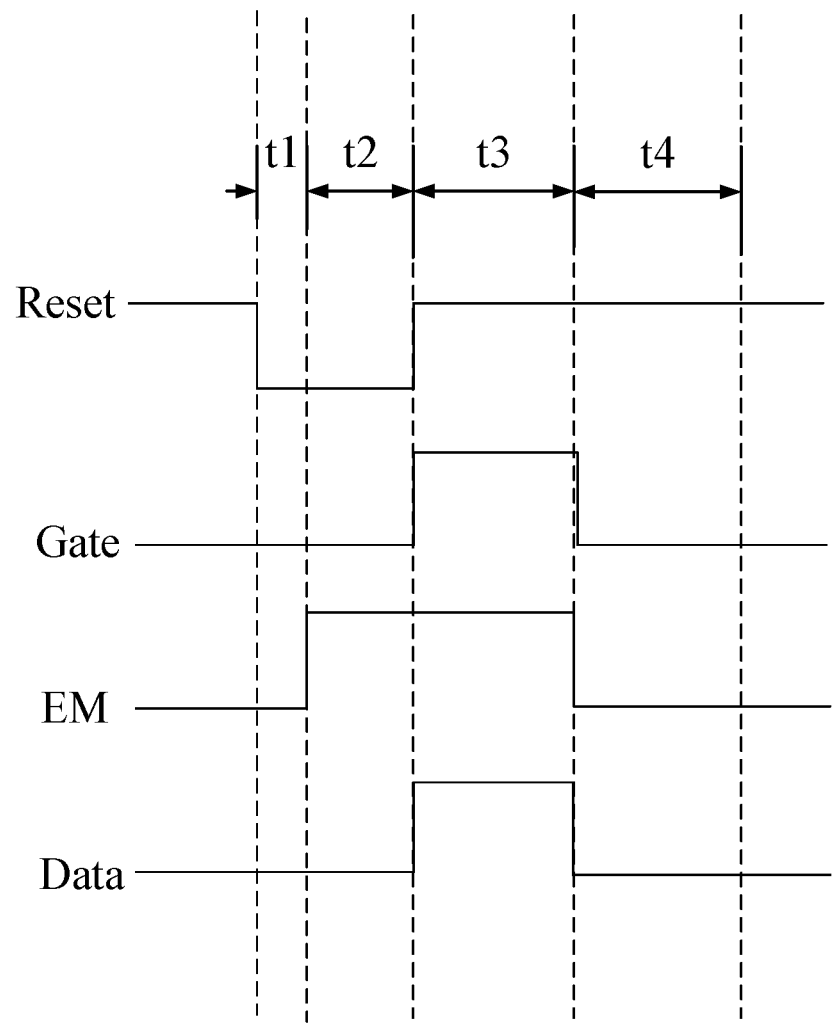
FIG. 5 is a timing diagram of respective nodes in a driving method of the pixel driving circuit of the present disclosure.

In this exemplary embodiment, as shown in FIG. 5, a timing diagram of respective nodes in a driving method of a pixel driving circuit of the present disclosure is shown. The driving method of the pixel driving circuit may include four phases: a reset phase t1, a compensation phase t2, a data-writing phase t3 and a light-emitting phase t4.

In the reset phase t1, low level signals are input to the reset signal end Reset and the enable signal end EM, the fourth switch transistor T4, the fifth switch transistor T5, the second switch transistor T2 and the third switch transistor T3 are turned on, and the low level signal of the reset signal end Reset resets the first node N1 and the second node N2.

In the compensation phase t2, a low level signal is input to the reset signal end Reset, a high level signal is input to the enable signal end EM, the fourth switch transistor T4 and the fifth switch transistor T5 are turned on, and the second switch transistor T2 and the third switch transistor T3 are turned off. The reset signal end Reset writes the voltage Vref−Vth to the third node N3, wherein Vref is a low level voltage value being input to the reset signal end Reset, and Vth is the threshold voltage of the driving transistor DT. At this time, total charges Q1, stored on the first capacitor C1 and the second capacitor C2 by the third node N3, =(Vref−Vth−Vdd)C2+(Vref−Vth−Vref)C1, where C1 is a capacitance value of the first capacitor C1 value, C2 is a capacitance value of the second capacitor C2, and Vdd is a voltage value of the first power supply end VDD. Vref may be −2V.

In the data-writing phase t3, high level signals are input to the reset signal end Reset, the gate driving signal end Gate and the enable signal end EM, the fourth switch transistor T4, the fifth switch transistor T5, the second switch transistor T2 and the third switch transistor T3 are turned off, the first switch transistor T1 is turned on, and the data signal end Data writes a data signal to the first node. At this time, total charges Q2, stored in the first capacitor C1 and the second capacitor C2 by the third node N3, =(Vs−Vdd)C2+(Vs−Vdata)C1, where Vs is a voltage of the third node N3 in the data-writing phase t3, and Vdata is a voltage of the data signal. According to the charge conservation principle at the third node N3, Q1=Q2, so it may be obtained: Vs=C1(Vdata−Vref)/(C1+C2)+Vref−Vth.

In the light-emitting phase t4, the signal of the enable signal end EM becomes a low level, the second switch transistor T2 and the third switch transistor T3 are turned on, at this time, the voltage of the third node N3 changes from Vs to Vdd, and under a bootstrap action of the first capacitor C1, the voltage of the first node N1 changes from Vdata to C2(Vdata−Vref)/(C1+C2)+Vdd+Vth. According to the output characteristics of the drive transistor, the output current I, of the drive transistor DT at this time, $=(\mu WCox/2L)(Vgs-Vth)^2=(\mu WCox/2L)[C2(Vdata-Vref)/(C1+C2)]^2$, where, $\mu$ is carrier mobility; Cox is gate capacitance per unit area, W is a width of channel of the drive transistor, L is a length of channel of the drive transistor, Vgs is a gate-source voltage difference of the drive transistor, and Vth is the threshold voltage of the drive transistor. According to the above formula, the pixel driving circuit can avoid influence of the threshold voltage of the driving transistor and the voltage drop of power supply line of the first power supply end VDD on driving current.

In this exemplary embodiment, low level voltage values being input to the reset signal end Reset in the reset phase t1 and the compensation phase t2 may be the same, that is, the reset signal end Reset only needs one driving action in the reset phase t1 and the compensation phase t2, such that the reset signal end Reset can have less power consumption. The voltage of the first node N1 of the pixel driving circuit in the light-emitting phase t4 is C2(Vdata−Vref)/(C1+C2)+Vdd+Vth. Vdd may be a relatively large high level voltage to provide a driving voltage of the light-emitting sub-circuit, a value of Vref may be relatively small (for example, −2V) to ensure that the first node N1 and an anode of the light-emitting sub-circuit may be reset to a lower voltage in the reset phase t1, so as to ensure that the light-emitting sub-circuit is turned off, and at the same time, an absolute value of Vdata may be set in a relatively small value range, so as to reduce power consumption of the display panel. Therefore, the voltage of the first node N1, C2(Vdata−Vref)/(C1+C2)+Vdd+Vth, is generally a relatively large high level signal. In this exemplary embodiment, the fourth switch transistor and the fifth switch transistor may be set with P-type transistors, and at the same time, a relatively large high level signal may be input to the reset signal end Reset in the light-emitting phase t4. Therefore, in the light-emitting phase t4, the reset signal end Reset can thoroughly turn off the fourth switch transistor and the fifth switch transistor, and at the same time, a high level signal voltage being input to the reset signal end Reset may be close to the voltage of the first node, thereby reducing current leakage from the first node to the reset signal end.

In this exemplary embodiment, the fourth switch transistor T4 is a polysilicon transistor. Since leakage current of the low temperature polysilicon transistor is relatively large, in order to avoid that the first node N1 leaks curent to the reset signal end Reset through the fourth switch transistor T4 in the light-emitting phase, in this exemplary embodiment, C2(Vdata−Vref)/(C1+C2)+Vdd+Vth−Vinit<V1, wherein, C2(Vdata−Vref)/(C1+C2)+Vdd+Vth is the voltage of the first node N1 in the light-emitting phase, Vinit is the high level voltage being input to the reset signal end Reset in the light-emitting phase, and V1 is a preset voltage value. V1 may be a small value, and in this exemplary embodiment, it may reduce the leakage current from the first node N1 to the reset signal end Reset by reducing a voltage difference between the first node N1 and the reset signal end Reset. Vinit may be 4V.

The exemplary embodiment further provides a driving method for a pixel driving circuit, for driving the above-mentioned pixel driving circuit, and the method includes:

In the reset phase, a turn-on signal is input to the reset signal end, and at the same time, a turn-on signal is input to the enable signal end.

In the compensation phase, a turn-on signal is input to the reset signal end, and at the same time, a turn-off signal is input to the enable signal end.

In the data-writing phase, a data signal is input to the data signal end, and at the same time, a turn-on signal is input to the gate driving signal end and a turn-off signal is input to the reset signal end.

In the light-emitting phase, a turn-on signal is input to the enable signal end, and at the same time, a turn-off signal is input to the reset signal end.

According to the above content, it can be learnt that the turn-on signal input to the reset signal end may be a low level, and the turn-off signal input to the reset signal end may be a high level; the turn-on signal input to the enable signal end may be a low level, and the turn-off signal input to the enable signal end may be a high level; and the turn-on signal input to the gate driving signal end may be a high level, and the turn-off signal input to the gate driving signal end may be a low level.

In this exemplary embodiment, C2(Vdata−Vref)/(C1+C2)+Vdd+Vth−Vinit<V1.

C1 is the capacitance value of the first capacitor, C2 is the capacitance value of the second capacitor, Vdata is the voltage value of the data signal, Vref is a voltage value of the turn-on signal input to the reset signal end in the compensation phase, Vdd is the voltage value of the first power end, Vth is the threshold voltage of the driving transistor, Vinit is a voltage value of the turn-off signal input to the reset signal end in the light-emitting phase, and V1 is a preset voltage value.

The driving method of the pixel driving circuit has been described in detail in the above content, and will not be repeated here.

Figure 6:
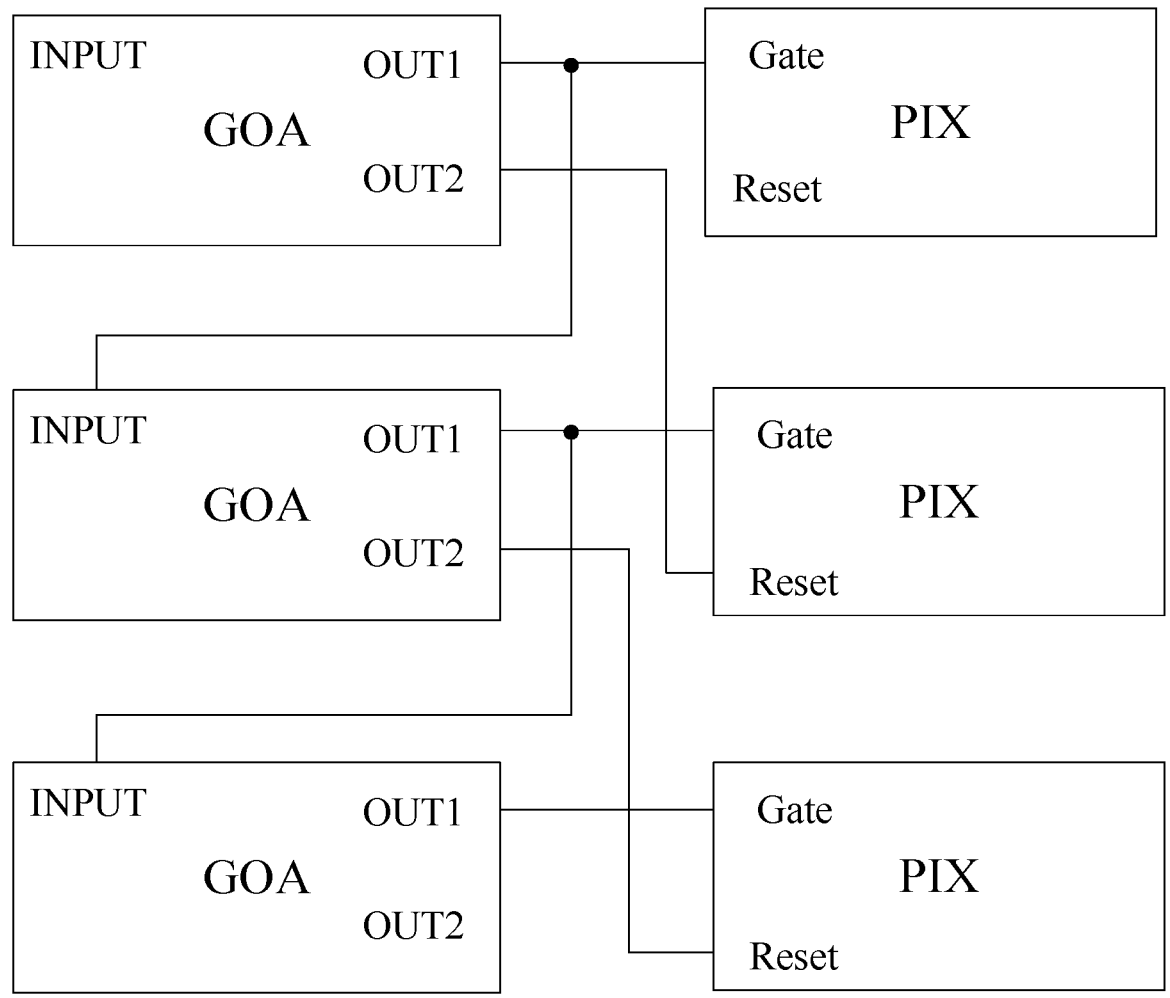
FIG. 6 is a schematic structural diagram of an exemplary embodiment of a display panel of the present disclosure.

The exemplary embodiment further provides a display panel, as shown in FIG. 6, which is a schematic structural diagram of an exemplary embodiment of the display panel of the present disclosure. The display panel includes the above-mentioned pixel driving circuit, which is indicated by "PIX".

In this exemplary embodiment, the display panel includes both oxide transistors and low temperature polysilicon transistors. The display panel may include two active layers, one active layer may be a polysilicon layer, and the other active layer may be an oxide semiconductor layer. The polysilicon layer and the oxide semiconductor layer may be located on different layers, the oxide semiconductor layer may be on a side of the polysilicon layer distal to the base substrate, and an orthographic projection of the oxide semiconductor layer on the base substrate and an orthographic projections of the polysilicon layer on the base substrate at least partially overlap, such that the oxide transistor and the low temperature polysilicon transistor may be connected by a via hole.

In this exemplary embodiment, as shown in FIG. 6, the display panel may further include a gate driving circuit. The gate driving circuit may include a plurality of shift register sub-circuits, which is indicated by "GOA", cascaded one another. Each shift register sub-circuit GOA includes a first output end OUT1 and a second output end OUT2, and signal potentials of the first output end OUT1 and the second output end OUT2 of the shift register sub-circuit are logically opposite to each other. The first output end OUT1 of an n-th stage of shift register sub-circuit is connected to the gate driving signal end Gate of an n-th row of pixel driving circuit, for outputting a gate driving signal to the gate driving signal end Gate, the second output end OUT2 of the n-th stage of shift register sub-circuit is connected to the reset signal end Reset of an (n+1)-th row of pixel driving circuit adjacent, for outputting a turn-on signal or a turn-off signal to the reset signal end of the pixel driving circuit, and n is a positive integer greater than or equal to 1.

As shown in FIG. 6, the shift register sub-circuit may further include an input signal end INPUT, and the first output end OUT1 of an upper stage (n-th stage) of shift register sub-circuit may be connected to the input signal end INPUT of a next stage ((n+1)-th stage) of shift register sub-circuit.

Figure 7:
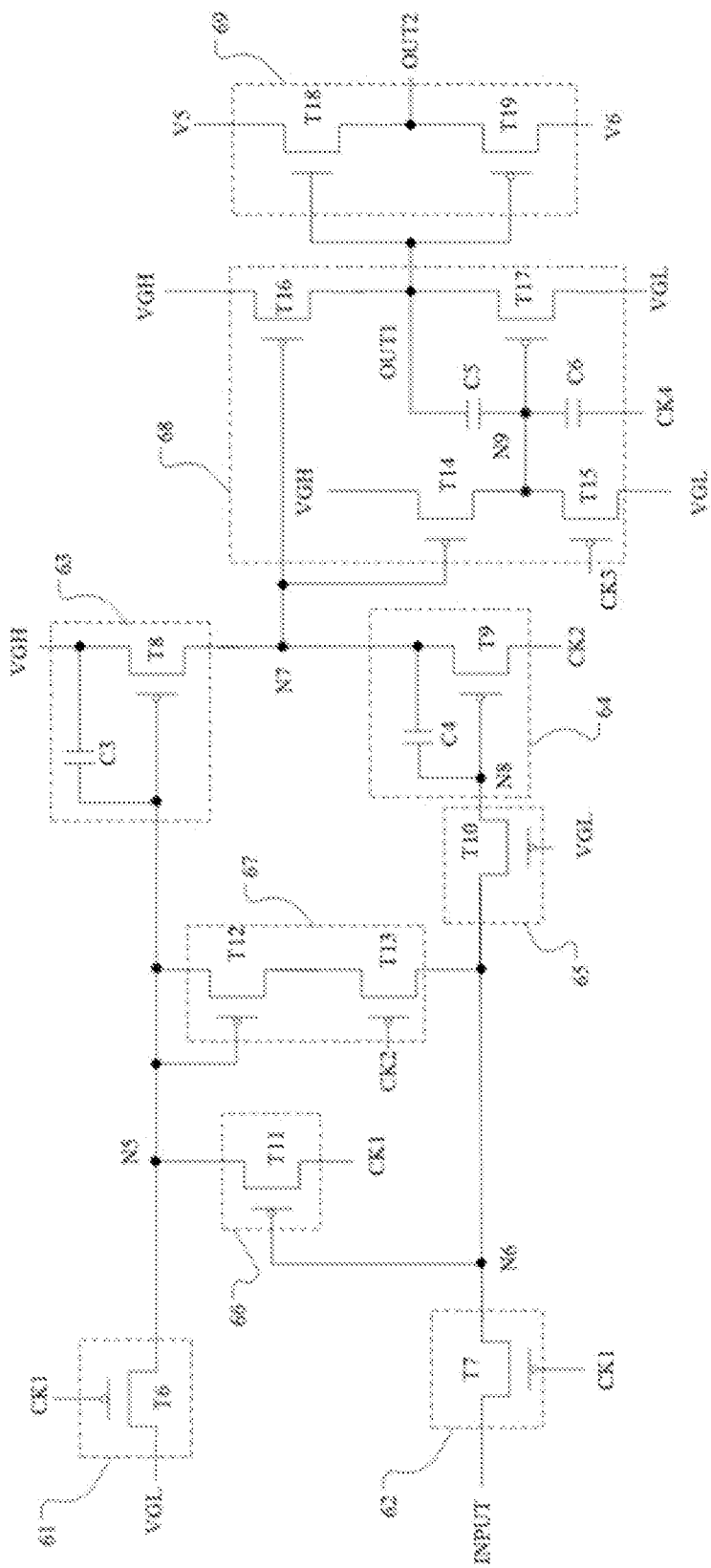
FIG. 7 is a schematic structural diagram of a shift register sub-circuit in an exemplary embodiment of a display panel of the present disclosure.

In this exemplary embodiment, as shown in FIG. 7, it is a schematic structural diagram of a shift register sub-circuit in an exemplary embodiment of the display panel of the present disclosure. The shift register sub-circuit includes: a first input circuit 61, a second input circuit 62, a first output circuit 63, a second output circuit 64, an isolation circuit 65, a first control circuit 66, a second control circuit 67, a second inverter circuit 68 and a first inverter circuit 69. The first input circuit 61 are connected to a third power supply end VGL, a fifth node N5 and a first clock signal end CK1, for transmitting a signal of the third power supply end VGL to the fifth node N5 in response to a signal of the first clock signal end CK1. The second input circuit 62 is connected to the first clock signal end CK1, the input signal end INPUT and a sixth node N6, for transmitting a signal of the input signal end INPUT to the sixth node N6 in response to the signal of the first clock signal end CK1. The first output circuit 63 is connected to the fifth node N5, a fourth power supply end VGH and a seventh node N7, for transmitting a signal of the fourth power supply end VGH to the seventh node N7 in response to a signal of the fifth node N5. The second output circuit 64 is connected to the seventh node N7, a second clock signal end CK2 and an eighth node N8, for transmitting a signal of the second clock signal end CK2 to the seventh node N7 in response to a signal of the eighth node N8. The isolation circuit 65 is connected to the sixth node N6 and the third power supply end VGL and the eighth node N8, for making the sixth node N6 connected to the eighth node N8 in response to the signal of the third power supply end VGL. The first control circuit 66 is connected to the fifth node N5, the first clock signal end CK1 and the sixth node N6, for transmitting the signal of the first clock signal end CK1 to the fifth node N5 in response to a signal of the sixth node N6. The second control circuit 67 is connected to the fifth node N5, the sixth node N6 and the second clock signal end CK2, for making the fifth node N5 connected to the sixth node N6 in response to the signals of both the fifth node N5 and the second clock signal end CK2 at the same time. The second inverter circuit 68 has an input end connected to the seventh node N7, and an output end connected to the first output end OUT1. The first inverter circuit 69 has an input end connected to the first output end OUT1, and an output end connected to the second output end OUT2.

In this exemplary embodiment, as shown in FIG. 7, the first input circuit 61 may include a sixth switch transistor T6, and the sixth switch transistor T6 has a first end connected to the third power supply end VGL, a second end connected to the fifth node N5, and a control end connected to the first clock signal end CK1. The second input circuit 62 may include a seventh switch transistor T7, and the seventh switch transistor T7 has a first end connected to the input signal end INPUT, a second end connected to the sixth node N6, and a control end connected to the first clock signal end CK1. The first output circuit 63 may include an eighth switch transistor T8 and a third capacitor C3, and the eighth switch transistor T8 has a first end connected to the fourth power supply end VGH, a second end connected to the seventh node N7, and a control end connected to the fifth node N5. The third capacitor C3 is connected between the fourth power supply end VGH and the fifth node N5. The second output circuit 64 may include a ninth switch transistor T9 and a fourth capacitor C4, and the ninth switch transistor T9 has a first end connected to the second clock signal end CK2, a second end connected to the seventh node N7, and a control end connected to the eighth node N8. The fourth capacitor C4 is connected between the eighth node N8 and the seventh node N7. The isolation circuit 65 may include a tenth switch transistor T10, and the tenth switch transistor T10 has a first end connected to the sixth node N6, a second end connected to the eighth node N8, and a control end connected to the third power supply end VGL. The first control circuit 66 may include an eleventh switch transistor T11, and the eleventh switch transistor T11 has a first end connected to the fifth node N5, a second end connected to the first clock signal end CK1, and a control end connected to the sixth node N6. The second control circuit 67 may include a twelfth switch transistor T12 and a thirteenth switch transistor T13, the twelfth switch transistor T12 has a first end connected to the fifth node N5, a second end, and a control end connected to the fifth node N5, and the thirteen switch transistor T13 has a first end connected to the second end of the twelfth switch transistor T12, a second end connected to the sixth node N6, and a control end is connected to the second clock signal end CK2. The second inverter circuit 68 may include: a fourteenth switch transistor T14, a fifteenth switch transistor T15, a sixteenth switch transistor T16, a seventeenth switch transistor T17, a fifth capacitor C5 and a sixth capacitor C6, the fourteenth switch transistor T14 has a first end connected to the fourth power supply end VGH, a second end connected to a ninth node N9, and a control end connected to the seventh node N7, the fifteenth switch transistor T15 has a first end connected to the third power supply end VGL, a second end connected to the ninth node N9, and a control end connected to the third clock signal end CK3, the sixteenth switch transistor T16 has a first end connected to the fourth power supply end VGH, a second end connected to the first output end OUT1, and a control end connected to the seventh node N7, the seventeenth switch transistor T17 has a first end connected to the third power supply end VGL, a second end connected to the first output end OUT1, and a control end connected to the ninth node N9, the fifth capacitor C5 is connected between the first output end OUT1 and the ninth node N9, and the sixth capacitor C6 is connected between the ninth node N9 and the fourth clock signal end CK4. The first inverter circuit 69 may include: an eighteenth N-type switch transistor T18 and a nineteenth P-type switch transistor T19, the eighteenth N-type switch transistor T18 has a first end connected to a fifth power supply end V5, a second end connected to the second output end OUT2, and a control end connected to the first output end OUT1, and the nineteenth P-type switch transistor T19 has a first end connected to a sixth power supply end V6, a second end connected to the second output end terminal OUT2, and a control end connected to the first output end OUT1.

In this exemplary embodiment, the sixth to nineteenth switch transistors may all be P-type transistors. It should be understood that, in other exemplary embodiments, the sixth to nineteenth switch transistors may be N-type transistors as well.

Figure 8:
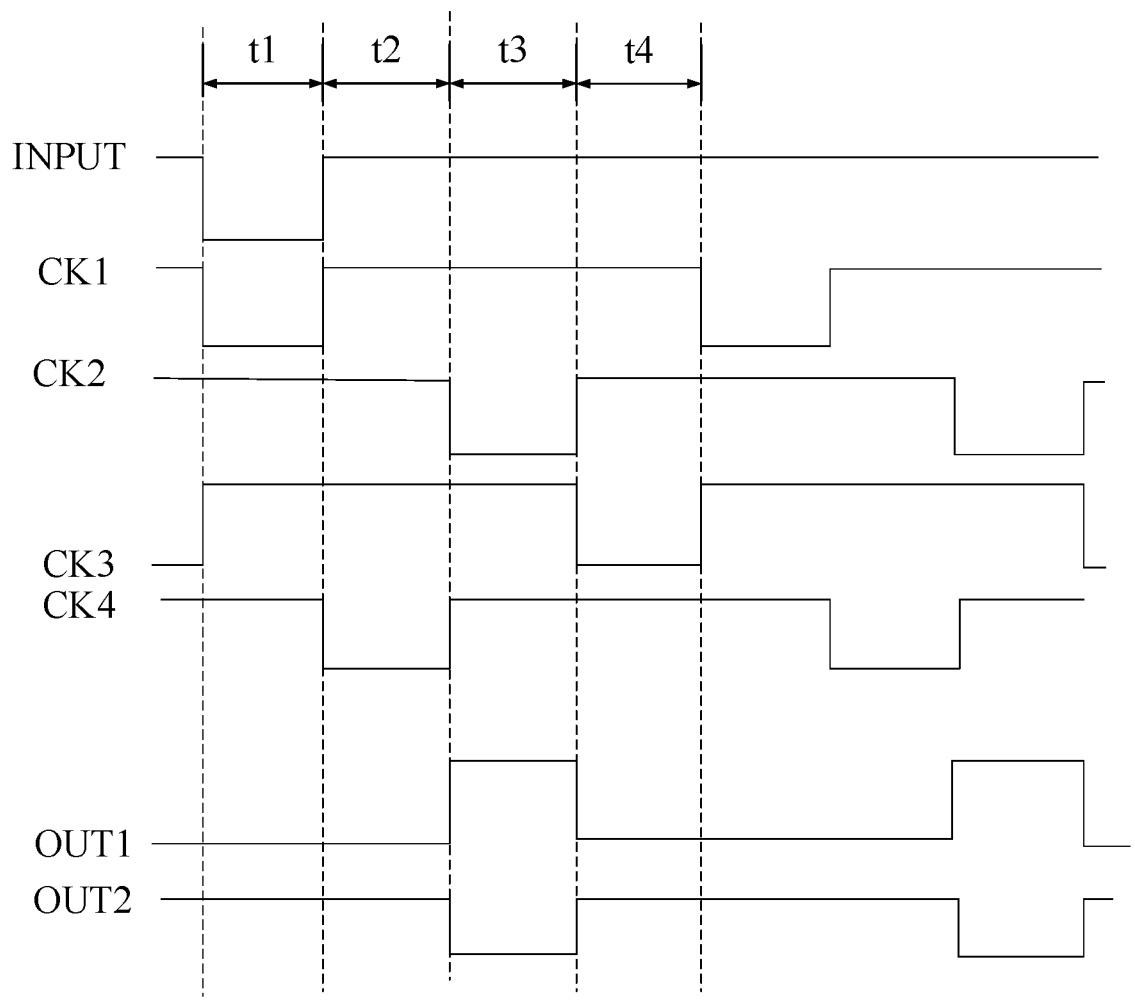
FIG. 8 is a timing diagram of respective nodes in a driving method of the shift register sub-circuit in FIG. 7.

As shown in FIG. 8, it is a timing diagram of the respective nodes in the driving method of the shift register sub-circuit in FIG. 7. The third power supply end VGL and the fifth power supply end V5 may continuously output low level signals, and the fourth power supply end VGH and the sixth power supply end V6 may continuously output high level signals. A voltage of the fifth power supply end V5 may be the aforementioned Vref, and a voltage of the sixth power supply end V6 may be the aforementioned Vinit. The driving method of shift register sub-circuit includes four phases: a first phase t1, a second phase t2, a third phase t3 and a fourth phase t4.

In the first phase t1, low level signals are input to the input signal end INPUT and the first clock signal end CK1, and a high level signal is input to the second clock signal end. The sixth switch transistor and the seventh switch transistor T7 are turned on, a low level signal of the third power supply end VGL is transmitted to the fifth node N5, and a low level signal of the input signal end INPUT is transmitted to the sixth node N6. The eighth switch transistor T8 and the ninth switch transistor T9 are turned on, and high level signals of the fourth power supply end VGH and the second clock signal end CK2 are transmitted to the seventh node N7. The sixteenth switch transistor T16 is turned off, and the ninth node N9 maintains a low level signal of a previous phase, such that the first output end OUT1 continuously output a low level signal and the second output end OUT2 outputs a high level signal.

In the second phase t2, high level signals are input to the input signal end INPUT and the first clock signal end CK1, the sixth switch transistor T6 and the seventh switch transistor T7 are turned off, the sixth node N6 maintains continuously a low level signal under an action of the fourth capacitor C4, the eleventh switch transistor T11 is turned on, the first clock signal end CK1 writes a high level signal to the fifth node N5, the eighth switch transistor T8 is turned off, and the seventh node continuously outputs a high level signal. At the same time, a low level signal is input to the fourth clock signal end to pull down a voltage of the ninth node N9, to ensure that the seventeenth switch transistor T17 is turned on, the first output end OUT1 continuously outputs a low level signal, and the second output end OUT2 outputs a high level signal.

In the third phase t3, high level signals are input to the input signal end INPUT and the first clock signal end CK1, the sixth switch transistor T6 and the seventh switch transistor T7 are turned off, the fifth node N5 continuously to be a high level under an action of the third capacitor C3, and the sixth node N6 maintains continuously the low level under the action of the fourth capacitor C4. A low level signal is input to the second clock signal end CK2, to write a low level signal to the seventh node N7. At this time, the sixteenth switch transistor T16 is turned on, the high level signal of the fourth power supply end VGH is transmitted to the first output end OUT1, and the second output end OUT2 outputs a low level signal at the same time. In addition, the fourth power supply end VGH outputs a high level signal to the ninth node N9.

In the fourth phase t4, a high level signal is input to the second clock signal end CK2 to output a high level signal to the seventh node N7, and the sixteenth switch transistor T16 is turned off. A low level signal is input to the third clock signal end CK3, the fifteenth switch transistor T15 is turned on, the low level signal of the third power supply end VGL is transmitted to the ninth node N9 through the fifteenth switch transistor T15, the seventeenth switch transistor T17 is turned on, the low level signal of the third power supply end VGL is transmitted to the first output end OUT1, and at the same time, the second output end OUT2 outputs a high level signal.

Other embodiments of the present disclosure will readily occur to those skilled in the art upon consideration of the specification and practice of the disclosure disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A pixel driving circuit, comprising:
a data-writing circuit, a driving circuit, a light-emitting control circuit, a compensation circuit, and a storage circuit, wherein:
the data-writing circuit is coupled to the driving circuit for writing a data signal to the driving circuit;
the driving circuit is coupled to a first power supply end and a light-emitting sub-circuit through the light-emitting control circuit for inputting a driving current to the light-emitting sub-circuit according to the data signal under control of the light-emitting control circuit;
the compensation circuit is coupled to the driving circuit;
the storage circuit is coupled between the first power supply end and the driving circuit; and
the data-writing circuit and the compensation circuit together comprise at least two transistors, wherein, in the data-writing circuit and the compensation circuit, at least one transistor is a low temperature polysilicon transistor, and at least one transistor is an oxide transistor; wherein:
the data-writing circuit is connected to a data signal end, a gate driving signal end and a first node, for transmitting a signal of the data signal end to the first node in response to a signal of the gate driving signal end;
the driving circuit is connected to the first node, a second node, and a third node, for inputting the driving current to the second node according to a signal of the first node;
the light-emitting control circuit is connected to the third node, the second node, the first power supply end, a fourth node and an enable signal end, for transmitting a signal of the first power supply end to the third node in response to a signal of the enable signal end, and for transmitting a signal of the second node to the fourth node in response to the signal of the enable signal end;
the compensation circuit is connected to the first node, the second node and a reset signal end, for transmitting a signal of the reset signal end to the first node and the second node in response to the signal of the reset signal end;
the storage circuit comprises a first storage circuit and a second storage circuit;
the first storage circuit is connected between the first node and the third node;
the second storage circuit is connected between the third node and the first power supply end; and
the light-emitting sub-circuit is connected between the fourth node and a second power supply end.

2. The pixel driving circuit according to claim 1, wherein the data-writing circuit and the compensation circuit together comprise at least two transistors connected to the first node, wherein in the transistors of the data-writing circuit and the compensation circuit connected to the first node, at least one transistor is a low temperature polysilicon transistor, and at least one transistor is an oxide transistor.

3. The pixel driving circuit according to claim 2, wherein the second storage circuit comprises: a second capacitor, connected between the third node and the first power supply end.

4. The pixel driving circuit according to claim 2, wherein:
the data-writing circuit comprises: a first switch transistor, having a first end connected to the data signal end, a second end connected to the first node, and a control end connected to the gate driving signal end;
the drive circuit comprises: a driving transistor, having a first end connected to the third node, a second end connected to the second node, and a control end connected to the first node;
the light-emitting control circuit comprises: a second switch transistor, having a first end connected to the first power supply end, a second end connected to the third node, and a control end connected to the enable signal end; and a third switch transistor, having a first end connected to the second node, a second end connected to the fourth node, and a control end connected to the enable signal end; and
the compensation circuit comprises: a fourth switch transistor, having a first end connected to the reset signal end, a second end connected to the first node, and a control end connected to the reset signal end; and a fifth switch transistor, having a first end connected to the reset signal end, a second end connected to the second node, and a control end is connected to the reset signal end;
wherein the fourth switch transistor is an oxide transistor, and the second switch transistor, the third switch transistor, the first switch transistor, the fifth switch transistor and the driving transistor are low temperature polysilicon transistors.

5. The pixel driving circuit according to claim 1, wherein the data-writing circuit comprises: a first switch transistor, having a first end connected to the data signal end, a second end connected to the first node, and a control end connected to the gate driving signal end.

6. The pixel driving circuit according to claim 1, wherein the driving circuit comprises: a driving transistor, having a first end connected to the third node, a second end connected to the second node, and a control end connected to the first node.

7. The pixel driving circuit according to claim 1, wherein the light-emitting control circuit comprises:
a second switch transistor, having a first end connected to the first power supply end, a second end connected to the third node, and a control end connected to the enable signal end; and
a third switch transistor, having a first end connected to the second node, a second end connected to the fourth node, and a control end connected to the enable signal end.

8. The pixel driving circuit according to claim 1, wherein the compensation circuit comprises:
a fourth switch transistor, having a first end connected to the reset signal end, a second end connected to the first node, and a control end connected to the reset signal end; and
a fifth switch transistor, having a first end connected to the reset signal end, a second end connected to the second node, and a control end connected to the reset signal end.

9. The pixel driving circuit according to claim 1, wherein the first storage circuit comprises: a first capacitor, connected between the first node and the third node.

10. The pixel driving circuit according to claim 1, wherein:
the data-writing circuit comprises: a first switch transistor, having a first end connected to the data signal end, a second end connected to the first node, and a control end connected to the gate driving signal end;
the drive circuit comprises: a driving transistor, having a first end connected to the third node, a second end connected to the second node, and a control end connected to the first node;
the light-emitting control circuit comprises: a second switch transistor, having a first end connected to the first power supply end, a second end connected to the third node, and a control end connected to the enable signal end; and a third switch transistor, having a first end connected to the second node, a second end connected to the fourth node, and a control end connected to the enable signal end; and
the compensation circuit comprises: a fourth switch transistor, having a first end connected to the reset signal end, a second end connected to the first node, and a control end connected to the reset signal end; and a fifth switch transistor, having a first end connected to the reset signal end, a second end connected to the second node, and a control end is connected to the reset signal end;
wherein the first switch transistor is an oxide transistor, and the second switch transistor, the third switch transistor, the fourth switch transistor, the fifth switch transistor and the driving transistor are low temperature polysilicon transistors.

11. The pixel driving circuit according to claim 10, wherein the first switch transistor is an N-type switch transistor, and the second switch transistor, the third switch transistor, the fourth switch transistor, the fifth switch transistor and the driving transistor are P-type switch transistors.

12. A driving method of pixel driving circuit, comprising:
providing the pixel driving circuit according to claim 1;
in a reset phase, a turn-on signal is input to the reset signal end, and at the same time, a turn-off signal is input to the enable signal end;
in a compensation phase, a turn-on signal is input to the reset signal end, and at the same time, a turn-off signal is input to the enable signal end;
in a data-writing phase, a data signal is input to the data signal end, and at the same time, a turn-on signal is input to the gate driving signal end and a turn-off signal is input to the reset signal end; and
in a light-emitting phase, a turn-on signal is input to the enable signal end, and at the same time, a turn-off signal is input to the reset signal end.

13. The driving method of pixel driving circuit according to claim 12, wherein $$C2(V\text{data}-V\text{ref})/(C1+C2)+V\text{dd}+V\text{th}-V\text{init}<V1;$$

wherein C1 is a capacitance value of the first capacitor, C2 is a capacitance value of the second capacitor, Vdata is a voltage value of the data signal, Vref is a voltage value of the turn-on signal input to the reset signal end in the compensation phase, Vdd is a voltage value of the first power supply end, Vth is a threshold voltage of the driving transistor, Vinit is a voltage value of the turn-off signal input to the reset signal end in the light-emitting phase, and V1 is a preset voltage value.

14. A display panel, comprising the pixel driving circuit according to claim 1.

15. The display panel according to claim 14, wherein:
the display panel further comprises a gate drive circuit, the gate drive circuit comprises a plurality of shift register sub-circuits cascaded one another, each of the plurality of shift register sub-circuits comprises a first output end and a second output end, and signal potentials of the first output end and the second output end are logically opposite to each other;
the first output end of an n-th stage of shift register sub-circuit is connected to the gate driving signal end of an n-th row of pixel driving circuit, for outputting a gate driving signal to the gate driving signal end; and
the second output end of the n-th stage of shift register sub-circuit is connected to the reset signal end of an (n+1)-th row of pixel driving circuit, for outputting a turn-on signal or a turn-off signal to the reset signal end of the pixel driving circuit, where n is a positive integer greater than or equal to 1.

16. The display panel according to claim 15, wherein the shift register sub-circuit comprises:
a first input circuit, connected to a third power supply end, a fifth node and a first clock signal end, for transmitting a signal of the third power supply end to the fifth node in response to a signal of the first clock signal end;
a second input circuit, connected to the first clock signal end, an input signal end and a sixth node, for transmitting a signal of the input signal end to the sixth node in response to the signal of the first clock signal end;
a first output circuit, connected to the fifth node, a fourth power supply end and a seventh node, for transmitting a signal of the fourth power supply end to the seventh node in response to a signal of the fifth node;
a second output circuit, connected to the seventh node, a second clock signal end and a eighth node, for transmitting a signal of the second clock signal end to the seventh node in response to a signal of the eighth node;
an isolation circuit, connected to the sixth node, a third power supply end and the eighth node, for connecting the sixth node to the eighth node in response to a signal of the third power supply end;
a first control circuit, connected to the fifth node, the first clock signal end and the sixth node, for transmitting the signal of the first clock signal end to the fifth node in response to a signal of the sixth node;
a second control circuit, connected to the fifth node, the sixth node and the second clock signal end, for connecting the fifth node to the sixth node in response to the signals of both the fifth node and the second clock signal end at the same time;
a second inverter circuit, having an input end connected to the seventh node, and an output end is connected to the first output end; and
a first inverter circuit, having an input end connected to the first output end, and an output end connected to the second output end.

17. The display panel according to claim 16, wherein the first input circuit comprises:
a sixth switch transistor, having a first end connected to the third power supply end, a second end connected to the fifth node, and a control end connected to the first clock signal end;

the second input circuit comprises:
a seventh switch transistor, having a first end connected to the input signal end, a second end connected to the sixth node, and a control end connected to the first clock signal end;
the first output circuit comprises:
an eighth switch transistor, having a first end connected to the fourth power supply end, a second end connected to the seventh node, and a control end connected to the fifth node; and
a third capacitor, connected between the fourth power supply end and the fifth node;
the second output circuit comprises:
a ninth switch transistor, having a first end connected to the second clock signal end, a second end connected to the seventh node, and a control end connected to the eighth node; and
a fourth capacitor, connected between the eighth node and the seventh node;
the isolation circuit comprises:
a tenth switch transistor, having a first end connected to the sixth node, a second end connected to the eighth node, and a control end connected to the third power supply end;
the first control circuit comprises:
an eleventh switch transistor, having a first end connected to the fifth node, a second end connected to the first clock signal end, and a control end connected to the sixth node;
the second control circuit comprises:
a twelfth switch transistor, having a first end connected to the fifth node, a second end, and a control end connected to the fifth node; and
a thirteenth switch transistor, having a first end connected to the second end of the twelfth switch transistor, a second end connected to the sixth node, and a control end connected to the second clock signal end;
the second inverter circuit comprises:
a fourteenth switch transistor, having a first end connected to the fourth power supply end, a second end connected to the ninth node, and a control end is connected to the seventh node;
a fifteenth switch transistor, having a first end connected to the third power supply end, a second end connected to the ninth node, and a control end connected to the third clock signal end;
a sixteenth switch transistor, having a first end connected to the fourth power supply end, a second end connected to the first output end, and a control end connected to the seventh node;
a seventeenth switch transistor, having a first end connected to the third power supply end, a second end connected to the first output end, and a control end is connected to the ninth node;
a fifth capacitor, connected between the first output end and the ninth node; and
a sixth capacitor, connected between the ninth node and the fourth clock signal end; and
the first inverter circuit comprises:
an eighteenth N-type switch transistor, having a first end connected to the fifth power supply end, a second end connected to the second output end, and a control end connected to the first output end; and
a nineteenth P-type switch transistor, having a first end connected to the sixth power supply end, a second end connected to the second output end, and a control end connected to the first output end.

18. The display panel according to claim 15, wherein:

the data-writing circuit comprises: a first switch transistor, having a first end connected to the data signal end, a second end connected to the first node, and a control end connected to the gate driving signal end;

the drive circuit comprises: a driving transistor, having a first end connected to the third node, a second end connected to the second node, and a control end connected to the first node;

the light-emitting control circuit comprises: a second switch transistor, having a first end connected to the first power supply end, a second end connected to the third node, and a control end connected to the enable signal end; and a third switch transistor, having a first end connected to the second node, a second end connected to the fourth node, and a control end connected to the enable signal end; and the compensation circuit comprises: a fourth switch transistor, having a first end connected to the reset signal end, a second end connected to the first node, and a control end connected to the reset signal end; and a fifth switch transistor, having a first end connected to the reset signal end, a second end connected to the second node, and a control end is connected to the reset signal end;

wherein the first switch transistor is an oxide transistor, and the second switch transistor, the third switch transistor, the fourth switch transistor, the fifth switch transistor and the driving transistor are low temperature polysilicon transistors.

19. The display panel according to claim 15, wherein:

the data-writing circuit comprises: a first switch transistor, having a first end connected to the data signal end, a second end connected to the first node, and a control end connected to the gate driving signal end;

the drive circuit comprises: a driving transistor, having a first end connected to the third node, a second end connected to the second node, and a control end connected to the first node;

the light-emitting control circuit comprises: a second switch transistor, having a first end connected to the first power supply end, a second end connected to the third node, and a control end connected to the enable signal end; and a third switch transistor, having a first end connected to the second node, a second end connected to the fourth node, and a control end connected to the enable signal end; and the compensation circuit comprises: a fourth switch transistor, having a first end connected to the reset signal end, a second end connected to the first node, and a control end connected to the reset signal end; and a fifth switch transistor, having a first end connected to the reset signal end, a second end connected to the second node, and a control end is connected to the reset signal end;

wherein the fourth switch transistor is an oxide transistor, and the second switch transistor, the third switch transistor, the first switch transistor, the fifth switch transistor and the driving transistor are low temperature polysilicon transistors.

\* \* \* \* \*